United States Patent
Lee

(10) Patent No.: US 8,933,442 B2
(45) Date of Patent: Jan. 13, 2015

(54) THIN FILM TRANSISTOR SUBSTRATE AND DISPLAY

(71) Applicant: Innolux Corporation, Chu-Nan (TW)

(72) Inventor: Kuan-Feng Lee, Chu-Nan (TW)

(73) Assignee: Innolux Corporation, Chu-Nan (TW)

( * ) Notice: Subject to any disclaimer, the term of this patent is extended or adjusted under 35 U.S.C. 154(b) by 0 days.

(21) Appl. No.: 13/910,424

(22) Filed: Jun. 5, 2013

(65) Prior Publication Data

US 2013/0320317 A1    Dec. 5, 2013

(30) Foreign Application Priority Data

Jun. 5, 2012  (TW) ............... 101120063 A

(51) Int. Cl.
| | | |
|---|---|---|
| H01L 35/24 | (2006.01) | |
| H01L 51/00 | (2006.01) | |
| H01L 29/04 | (2006.01) | |
| H01L 31/036 | (2006.01) | |
| H01L 31/0376 | (2006.01) | |
| H01L 31/20 | (2006.01) | |
| H01L 29/76 | (2006.01) | |
| H01L 31/112 | (2006.01) | |
| G02F 1/136 | (2006.01) | |
| H01L 29/786 | (2006.01) | |
| H01L 27/12 | (2006.01) | |
| H01L 29/49 | (2006.01) | |

(52) U.S. Cl.
CPC ........ *H01L 29/78606* (2013.01); *H01L 27/124* (2013.01); *H01L 29/786* (2013.01); *H01L 29/4908* (2013.01); *H01L 29/7869* (2013.01)
USPC .......... 257/40; 257/57; 257/66; 257/E29.273; 349/43

(58) Field of Classification Search
CPC ............ H01L 29/78606; H01L 27/124; H01L 29/786
USPC ................... 257/40, 57, 66, E29.273; 349/43
See application file for complete search history.

(56) References Cited

U.S. PATENT DOCUMENTS

| | | |
|---|---|---|
| 2008/0303020 A1 | 12/2008 | Shin et al. |
| 2011/0204928 A1 | 8/2011 | Umezaki et al. |
| 2014/0077215 A1* | 3/2014 | Umezaki et al. ................ 257/59 |
| 2014/0124781 A1* | 5/2014 | Terai et al. ...................... 257/43 |

* cited by examiner

*Primary Examiner* — David S Blum
(74) *Attorney, Agent, or Firm* — Liu & Liu

(57) ABSTRACT

An embodiment of the invention provides a thin film transistor substrate includes: a substrate; and a plurality of transistors, wherein each of the transistors includes a gate electrode disposed on the substrate; a first diffusion barrier layer disposed on the substrate and covering an upper surface and a ring sidewall of the gate electrode; a gate insulating layer disposed on the first diffusion barrier layer; an active layer disposed on the gate insulating layer and over the gate electrode; a source electrode disposed on the substrate and electrically connected to the active layer; a drain electrode disposed on the substrate and electrically connected to the active layer; and a protective layer covering the source electrode and the drain electrode.

20 Claims, 4 Drawing Sheets

US 8,933,442 B2

THIN FILM TRANSISTOR SUBSTRATE AND DISPLAY

CROSS REFERENCE TO RELATED APPLICATIONS

This Application claims priority of Taiwan Patent Application No. 101120063, filed on Jun. 5, 2012, the entirety of which is incorporated by reference herein.

BACKGROUND OF THE INVENTION

1. Field of the Invention

The present invention relates to a thin film transistor, and in particular relates to a thin film transistor substrate, having a diffusion barrier layer, and a display using the same.

2. Description of the Related Art

With the progress in display technologies, lifestyles of humans have become more convenient with the assistance of display devices. With demands of being light and thin, the flat panel displays (FPD) have now become most popular displays. Among the variety of FPDs, liquid crystal displays (LCDs) are highly preferred due to advantages such as, providing the ability for more efficient space utilization, low power consumption, no radiation output, and low electromagnetic interference (EMI).

Liquid crystal displays are mainly composed of an active array substrate, a color filter substrate, and a liquid crystal layer located therebetween. The active array substrate has an active region and a periphery circuit region. The active arrays are located in the active region, and the driving circuits having a plurality of thin film transistors are located in the periphery circuit region. In thin film transistors, a gate insulating layer is used to separate a gate electrode from an active layer to insulate the gate electrode from the active layer. However, it is easy for the material of the gate electrode to diffuse into the gate insulating layer, which affects the insulating property of the gate insulating layer.

BRIEF SUMMARY OF THE INVENTION

An embodiment of the invention provides a thin film transistor substrate which includes: a substrate; and a plurality of thin film transistors disposed on the substrate, wherein each of the thin film transistors comprises: a gate electrode disposed on the substrate; a first diffusion barrier layer disposed on the substrate and covering the gate electrode; a gate insulating layer disposed on the first diffusion barrier layer; an active layer disposed on the gate insulating layer and over the gate electrode; a source electrode disposed on the substrate and electrically connected to the active layer; a drain electrode disposed on the substrate and electrically connected to the active layer; and a protective layer covering the source electrode and the drain electrode.

An embodiment of the invention provides a display, which includes: a thin film transistor substrate; a substrate disposed opposite to the thin film transistor substrate; and a display medium disposed between the thin film transistor substrate and the substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1:
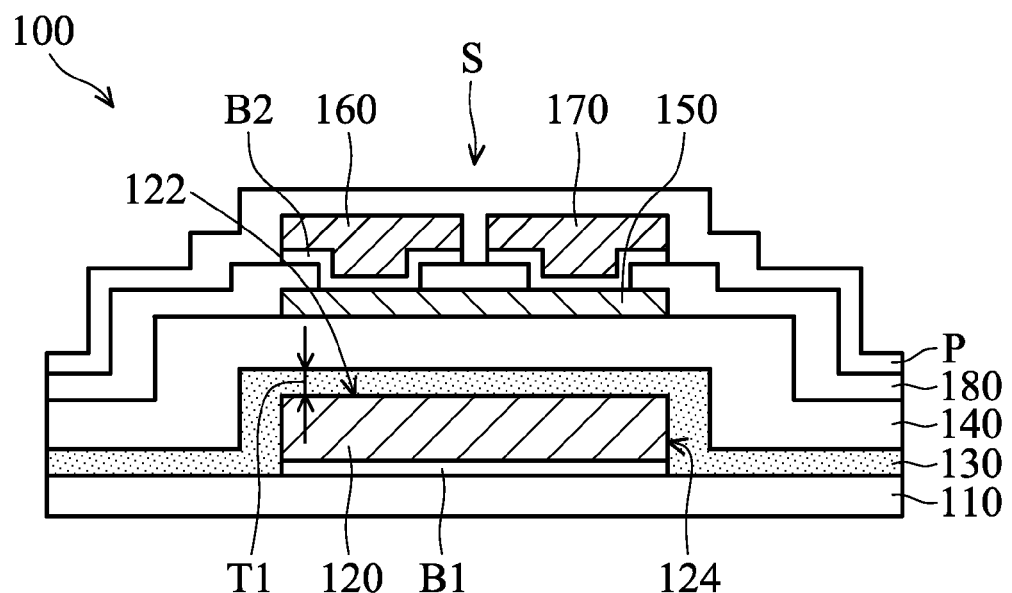
FIG. 1 is a cross-sectional view of a thin film transistor substrate according to an embodiment of the present invention.

FIG. 1 is a cross-sectional view of a thin film transistor substrate according to an embodiment of the present invention. Referring to FIG. 1, in the present embodiment, the thin film transistor substrate 100 includes a substrate 110 and a plurality of thin film transistors S on the substrate 110. It should be noted that, for the sake of simplicity, FIG. 1 shows only one thin film transistors S for illustration, but does not limit the invention thereto.

Each thin film transistor S includes a gate electrode 120, a first diffusion barrier layer 130, a gate insulating layer 140, an active layer 150, a source electrode 160, a drain electrode 170, and a protective layer P. Furthermore, the thin film transistor substrate 100 may optionally include an insulating layer 180.

Specifically, the gate electrode 120 is disposed on the substrate 110. The substrate 110 includes, for example, glass or other suitable transparent materials. The gate electrode 120 includes, for example, copper, aluminum, molybdenum, or other suitable conductive materials.

The first diffusion barrier layer 130 is disposed on the substrate 110 and covers an upper surface 122 and a surrounding sidewall 124 connecting to the upper surface 122 of the gate electrode 120. Specifically, in the present embodiment, the first diffusion barrier layer 130 conformally covers the upper surface 122 and the surrounding sidewall 124 of the gate electrode 120.

The first diffusion barrier layer 130 includes, for example, nitrides, metal oxides, combinations thereof, or other materials suitable to prevent the materials of the gate electrode 120, such as copper, from diffusing into the gate insulating layer 140. Specifically, the first diffusion barrier layer 130 may include silicon nitride, aluminum oxide, titanium oxide, hafnium oxide, silicon aluminum oxide, or combinations thereof. Furthermore, a thickness T1 of the first diffusion barrier layer 130 is, for example, about 10 Å to about 5000 Å. In one embodiment, the thickness T1 of the first diffusion barrier layer 130 may be about 500 Å to about 1000 Å.

The gate insulating layer 140 is disposed on the first diffusion barrier layer 130. The gate insulating layer 140 includes, for example, silicon oxide, silicon nitride or other suitable insulating materials. The struction of the gate insulating layer 140 is single layer or multi-layer. The active layer 150 is disposed on the gate insulating layer 140 and over the gate electrode 120, wherein the upper surface 122 of the gate electrode 120 faces the active layer 150. The active layer 150 includes, for example, indium gallium zinc oxide (IGZO) or other semiconductor materials suitable for the active layer.

The insulating layer 180 is disposed on the active layer 150 and covers the gate insulating layer 140, wherein the source electrode 160 and the drain electrode 170 are disposed on the insulating layer 180 and passes through the insulating layer 180 to connect to the active layer 150. The source electrode 160 and the drain electrode 170 include, for example, copper, aluminum, molybdenum, or other suitable conductive materials.

The thin film transistor substrate 100 may optionally further include a protective layer P, wherein the protective layer P is disposed on the source electrode 160 and the drain electrode 170 and covers the insulating layer 180 to protect the source electrode 160, the drain electrode 170 and the insulating layer 180 from environmental contaminants. The protective layer P includes silicon oxide or other suitable insulating materials.

Furthermore, the thin film transistor substrate 100 may optionally include a first bottom layer B1 and a second bottom layer B2. Specifically, the first bottom layer B1 is formed between the substrate 110 and the gate electrode 120 to bond the substrate 110 to the gate electrode 120. The second bottom layer B2 is formed between the source electrode 160 (or the drain electrode 170) and the active layer 150 to reduce the contact resistance between the source electrode 160 (or the drain electrode 170) and the active layer 150. The first bottom layer B1 and the second bottom layer B2 may include molybdenum, titanium, aluminum, chromium, alloys thereof, copper-manganese alloy, or combinations thereof. The first bottom layer B1 and the second bottom layer B2 have thicknesses ranging from about 1 Å to 3000 Å.

It should be noted that, in the present embodiment, the first diffusion barrier layer 130 completely covering the gate electrode 120 may effectively prevent the materials of the gate electrode 120 from diffusing into the gate insulating layer 140 to improve the electrical stability of the thin film transistor substrate 110.

Figure 2:
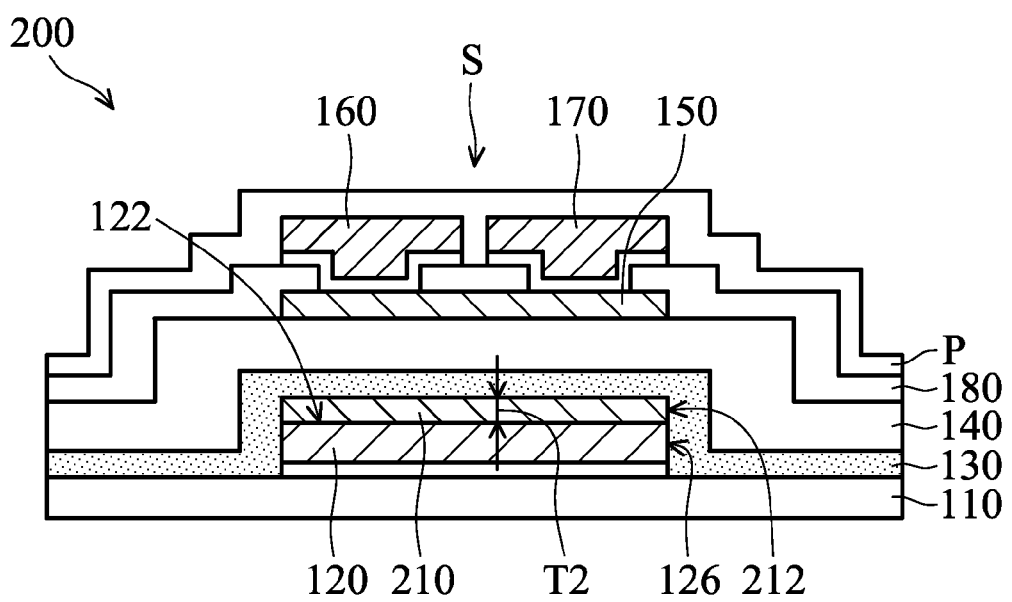
FIGS. 2 and 3 are cross-sectional views of thin film transistor substrates according to embodiments of the present invention.
Figure 3:
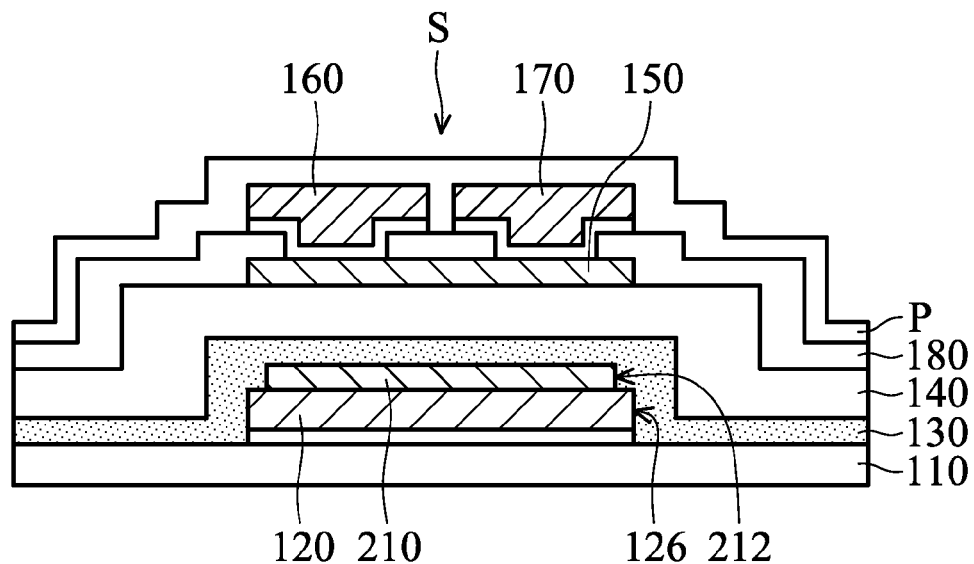

FIGS. 2 and 3 are cross-sectional views of thin film transistor substrates according to embodiments of the present invention. Referring to FIG. 2, the thin film transistor substrate 200 of the present embodiment is structurally similar to the thin film transistor substrate 100 of FIG. 1, except that the thin film transistor S of the thin film transistor substrate 200 of the present embodiment further includes a third diffusion barrier layer (i.e. a cap layer) 210.

Specifically, the third diffusion barrier layer 210 covers the upper surface 122 of the gate electrode 120 and is located between the gate electrode 120 and the first diffusion barrier layer 130 to prevent the materials of the gate electrode 120 from diffusing into the gate insulating layer 140. The thickness T2 of the third diffusion barrier layer 210 ranges about 1 Å to about 3000 Å. The third diffusion barrier layer 210 includes, for example, molybdenum, titanium, aluminum, chromium, alloys thereof, or other materials suitable to prevent the materials of the gate electrode 120 (e.g. copper) from diffusing into the gate insulating layer 140. In the present embodiment, an edge 212 of the third diffusion barrier layer 210 is aligned with an edge 126 (the surrounding sidewall 124) of the gate electrode 120. In another embodiment, as shown in FIG. 3, the edge 212 of the third diffusion barrier layer 210 is recessed from or aligned with the edge of the gate electrode 120. In the present embodiment, the edge of the third diffusion barrier layer 210 is recessed from the edge of the gate electrode 120. That is to say, the edge 212 of the third diffusion barrier layer 210 shrinks relative to the edge 126 of the gate electrode 120.

It should be noted that, because the edge 212 of the third diffusion barrier layer 210 is aligned with the edge 126 of the gate electrode 120 (as shown in FIG. 2) or is recessed from the edge 126 of the gate electrode 120 (as shown in FIG. 3), the first diffusion barrier layer 130 covering the third diffusion barrier layer 210 may cover the surrounding sidewall of the gate electrode 120 well.

Figure 4:
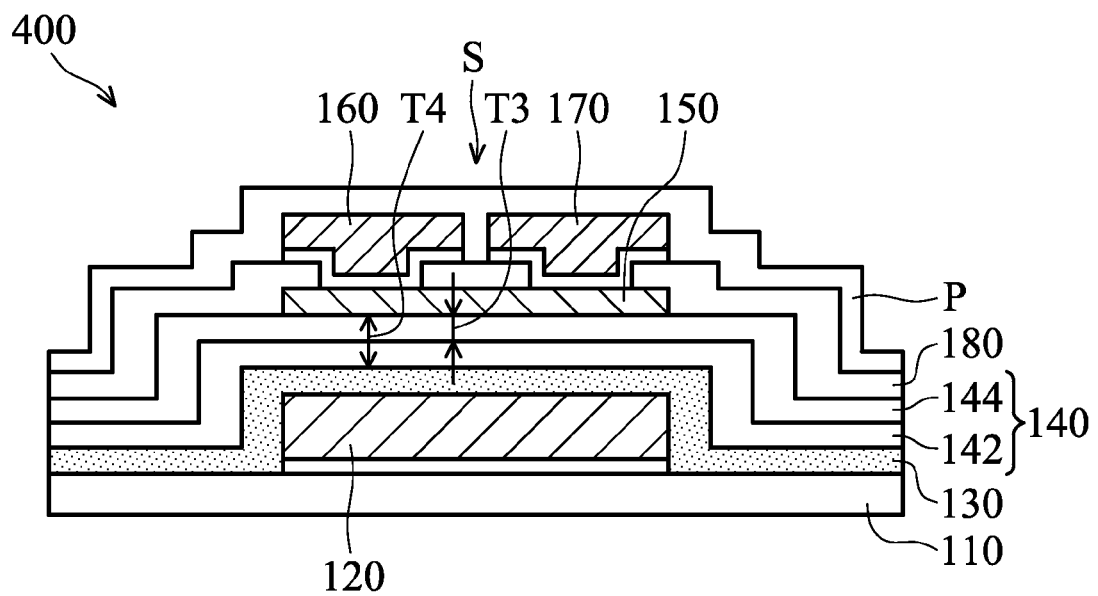
FIG. 4 is a cross-sectional view of a thin film transistor substrate according to an embodiment of the present invention.

FIG. 4 is a cross-sectional view of a thin film transistor substrate according to an embodiment of the present invention. Referring to FIG. 4, the thin film transistor substrate 400 of the present embodiment is structurally similar to the thin film transistor substrate 100 of FIG. 1, except that the gate insulating layer 140 of the thin film transistor substrate 400 of the present embodiment includes a first film 142 and a second film 144. Specifically, the first film 142 covers the first diffusion barrier layer 130, and the second film 144 is located on the first film 142. The hydrogen content of the second film 144 is less than that of the first film 142, and the hydrogen content of the second film 144 is less than or equal to about 20 atomic % and more than 0 atomic %.

The manufacturing method of the first film 142 and the second film 144 of an embodiment is described as follows. Firstly, a high hydrogen content process with a high deposition rate is performed to deposit the first film 142 onto the first diffusion barrier layer 130, wherein the ratio of nitrogen oxide to silane is, for example, less than 60 in the high hydrogen content process, and the deposition rate is, for example, 1000 Å per minute (in thickness). Then, a low hydrogen content process with a low deposition rate is performed to deposit the second film 144 onto the first film 142, wherein the ratio of nitrogen oxide to silane is, for example, larger than 60 for the low hydrogen content process, and the deposition rate is, for example, 500 Å per minute (in thickness).

Because hydrogen atoms may affect the electrical property of the active layer 150 and the gate insulating layer 140 needs to be thick enough, in the present embodiment, the first film 142 with the high hydrogen content and the high deposition rate is firstly deposited on the first diffusion barrier layer 130, and then the second film 144 with the low hydrogen content and the low deposition rate is deposited on the first film 142. As such, the first film 142 with the high deposition rate provides enough film thickness, and the active layer 150 only contacts the second film 144 with the low hydrogen content (not the first film 142 with the high hydrogen content) to prevent the hydrogen atoms from affecting the electrical property of the active layer 150. The thickness T3 of the second film 144 ranges, for example, from about 500 Å to about 1000 Å. The total thickness T4 of the gate insulating layer 140 is, for example, 5000 Å.

Figure 5:
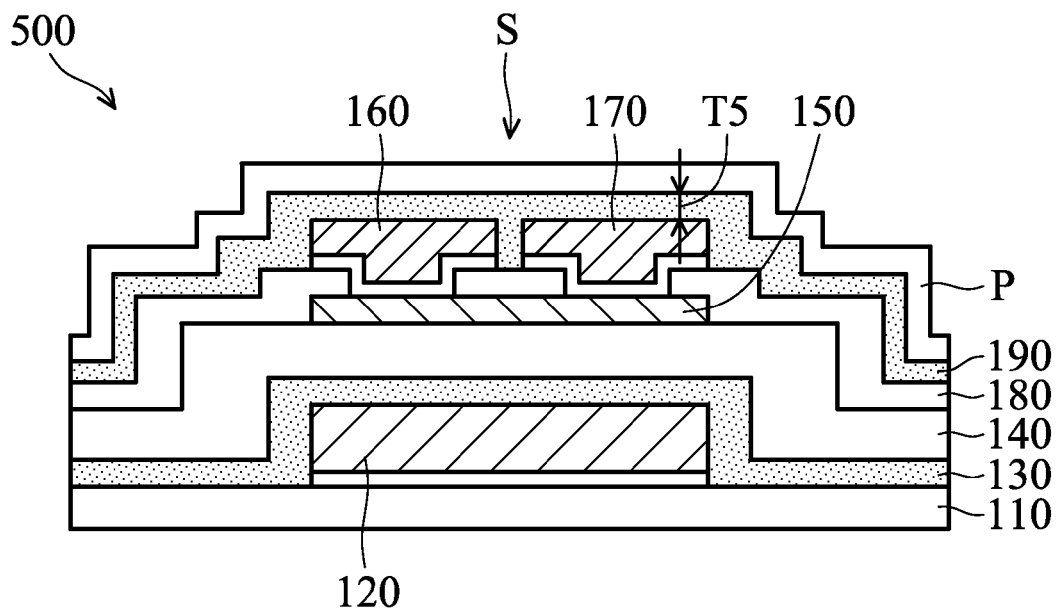
FIGS. 5 and 6 are cross-sectional views of thin film transistor substrates according to embodiments of the present invention.
Figure 6:
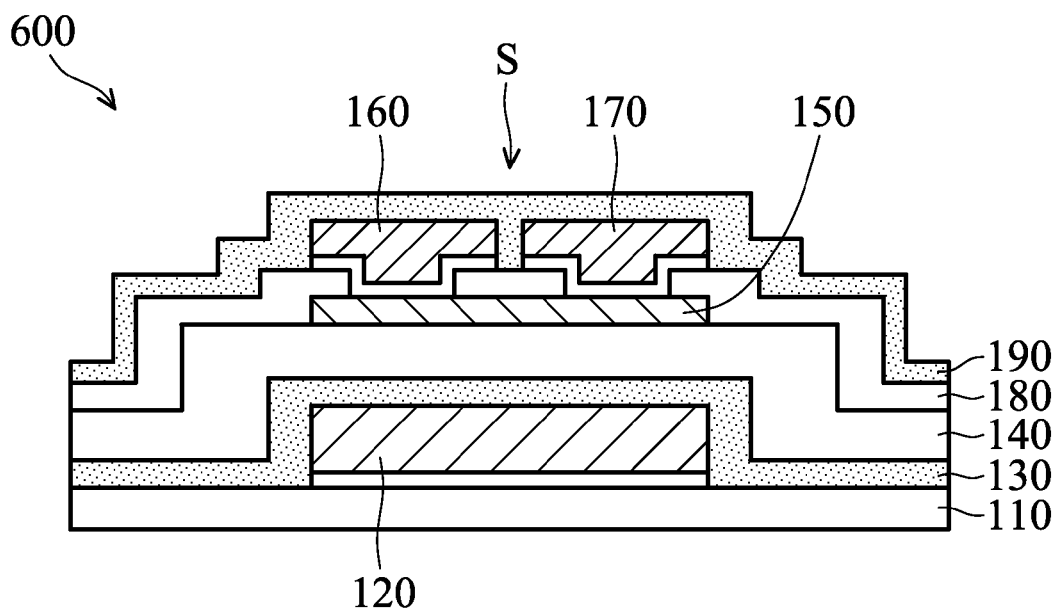

FIGS. 5 and 6 are cross-sectional views of thin film transistor substrates according to embodiments of the present invention. Referring to FIG. 5, the thin film transistor substrate 500 of the present embodiment is structurally similar to the thin film transistor substrate 100 of FIG. 1, except that the thin film transistor S of the thin film transistor substrate 500 of the present embodiment further includes a second diffusion barrier layer (i.e. a cap layer) 190.

Specifically, the second diffusion barrier layer 190 is disposed on the source electrode 160 and the drain electrode 170 and covers the insulating layer 180. The second diffusion barrier layer 190 may include, for example, silicon nitride, aluminum oxide, titanium oxide, hafnium oxide, silicon aluminum oxide, or combinations thereof. The material of the second diffusion barrier layer 190 may be, for example, the same as that of the first diffusion barrier layer 130. The material of the second diffusion barrier layer 190 may be, for example, different from that of the protective layer P. The thickness T5 of the second diffusion barrier layer 190 ranges, for example, from about 1000 Å to 2000 Å. In the present embodiment, the second diffusion barrier layer 190 is located between the insulating layer 180 and the protective layer P.

In other embodiments, as shown in FIG. 6, the second diffusion barrier layer 190 may completely replace the protective layer P, so in the thin film transistor substrate 600, the second diffusion barrier layer 190 may be used to cover and protect the source electrode 160, the drain electrode 170, and the insulating layer 180.

Figure 7:
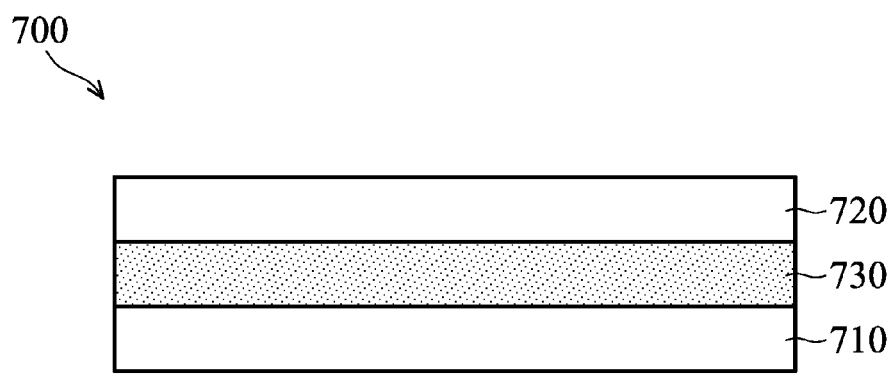
FIG. 7 is a cross-sectional view of a display according to an embodiment of the present invention.

FIG. 7 is a cross-sectional view of a display according to an embodiment of the present invention. Referring to FIG. 7, the display 700 of the present embodiment includes a thin film transistor substrate 710, a substrate 720, and a display medium 730 disposed therebetween. The thin film transistor substrate 710 may be the thin film transistor substrate as shown in FIGS. 1-6, and the display medium 730 is a liquid crystal layer or an organic light emitting layer. The substrate 720 is, for example, a color filter substrate or a transparent substrate.

In view of the foregoing, in the present invention, a diffusion barrier layer completely covering the gate electrode is formed between the gate electrode and the gate insulating layer to prevent the materials of the gate electrode from diffusing into the gate insulating layer to improve the electrical stability of the thin film transistor substrate.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thin film transistor substrate, comprising:
a substrate; and
a plurality of thin film transistors disposed on the substrate, wherein each of the thin film transistors comprises:
a gate electrode disposed on the substrate;
a first diffusion barrier layer disposed on the substrate and covering the gate electrode;
a gate insulating layer disposed on the first diffusion barrier layer, wherein the gate insulating layer comprises a first film layer and a second film layer disposed on the first film layer, wherein the first film layer covers the first diffusion barrier layer, the hydrogen content of the second film layer is less than that of the first film layer, and the hydrogen content of the second film layer is less than or equal to about 20 atomic percent and more than 0 atomic percent;
an active layer disposed on the gate insulating layer and over the gate electrode;
a source electrode disposed on the substrate and electrically connected to the active layer;
a drain electrode disposed on the substrate and electrically connected to the active layer; and
a protective layer covering the source electrode and the drain electrode.

2. The thin film transistor substrate as claimed in claim 1, wherein the first diffusion barrier layer comprises nitride, metal oxide, or combinations thereof.

3. The thin film transistor substrate as claimed in claim 2, wherein the nitride of the first diffusion barrier layer comprises silicon nitride.

4. The thin film transistor substrate as claimed in claim 2, wherein the metal oxide of the first diffusion barrier layer comprises aluminum oxide, titanium oxide, hafnium oxide, silicon aluminum oxide, or combinations thereof.

5. The thin film transistor substrate as claimed in claim 1, wherein a thickness of the first diffusion barrier layer is about 10 angstroms to 5000 angstroms.

6. The thin film transistor substrate as claimed in claim 5, wherein the thickness of the first diffusion barrier layer is about 500 angstroms to 1000 angstroms.

7. The thin film transistor substrate as claimed in claim 1, wherein the gate electrode has an upper surface and a surrounding sidewall, wherein a third diffusion barrier layer is disposed on the upper surface of the gate electrode, and the third diffusion barrier layer is between the gate electrode and the first diffusion barrier layer.

8. The thin film transistor substrate as claimed in claim 7, wherein an edge of the third diffusion barrier layer is recessed from or aligned with an edge of the gate electrode.

9. A display, comprising:
a thin film transistor substrate as claimed in claim 1;
a substrate disposed opposite to the thin film transistor substrate; and
a display medium disposed between the thin film transistor substrate and the substrate.

10. The display as claimed in claim 9, wherein the display medium is a liquid crystal layer.

11. The display as claimed in claim 9, wherein the display medium is an organic light emitting layer.

12. A thin film transistor substrate, comprising:
a substrate; and
a plurality of thin film transistors disposed over the substrate, wherein each of the thin film transistors comprises:
a gate electrode disposed on the substrate;
a first diffusion barrier layer disposed on the substrate and covering the gate electrode;
a gate insulating layer disposed on the first diffusion barrier layer;
an active layer disposed on the gate insulating layer and over the gate electrode;
a source electrode disposed on the substrate and electrically connected to the active layer;
a drain electrode disposed on the substrate and electrically connected to the active layer;
an insulating layer disposed on the active layer and covering the gate insulating layer, wherein the source electrode and the drain electrode are disposed over and passes through the insulating layer to connect to the active layer; and
a protective layer covering the source electrode and the drain electrode.

13. The thin film transistor substrate as claimed in claim 12, further comprising:
a second diffusion barrier layer disposed on the source electrode and the drain electrode and covering the insulating layer.

14. The thin film transistor substrate as claimed in claim 13, wherein the protective layer further covers the second diffusion barrier layer, and the protective layer has a material different from that of the second diffusion barrier layer.

15. The thin film transistor substrate as claimed in claim 13, wherein the second diffusion barrier layer has a thickness ranging from about 1000 Å to about 2000 Å.

16. The thin film transistor substrate as claimed in claim 13, wherein the first diffusion barrier layer has a material which is the same as that of the second diffusion barrier layer.

17. The thin film transistor substrate as claimed in claim 13, wherein a material of the second diffusion barrier layer comprises silicon nitride, aluminum oxide, titanium oxide, hafnium oxide, or silicon aluminum oxide.

18. The thin film transistor substrate as claimed in claim 7, wherein a material of the third diffusion barrier layer comprises molybdenum, titanium, aluminum, chromium, or alloys thereof.

19. A thin film transistor substrate, comprises:
a substrate; and
a plurality of thin film transistors disposed over the substrate, wherein each of the thin film transistors comprises:
a gate electrode disposed on the substrate;
a first diffusion barrier layer disposed on the substrate and covering the gate electrode;
a gate insulating layer disposed on the first diffusion barrier layer, wherein the gate electrode has an upper surface and a surrounding sidewall;
a third diffusion barrier layer disposed on the upper surface of the gate electrode, wherein the third diffusion barrier layer is between the gate electrode and the first diffusion barrier layer, wherein the third diffusion barrier layer is a separate layer that covers only the upper surface of the gate electrode, and wherein an edge of the third diffusion barrier layer is aligned with the surrounding sidewall of the gate electrodes;
an active layer disposed over the gate insulating layer and over the gate electrode;
a source electrode disposed over the substrate and electrically connected to the active layer;
a drain electrode disposed over the substrate and electrically connected to the active layer; and
a protective layer covering the source electrode and the drain electrode.

20. The display as claimed in claim 19, wherein the third diffusion barrier layer and the first diffusion barrier layer are made of different material.

* * * * *